United States Patent [19]

Suhr et al.

[11] Patent Number: 4,717,587

[45] Date of Patent: Jan. 5, 1988

[54] METHOD OF PRODUCING METALLIC STRUCTURES ON NON-CONDUCTORS

[75] Inventors: Harald Suhr, Tübingen; Christian Oehr, Reusten; Ernst Feurer, Tübingen, all of Fed. Rep. of Germany

[73] Assignee: Schering Aktiengesellschaft, Berlin and Bergkamen, Fed. Rep. of Germany

[21] Appl. No.: 840,648

[22] Filed: Mar. 17, 1986

[30] Foreign Application Priority Data

Mar. 22, 1985 [DE]  Fed. Rep. of Germany ....... 3510982

[51] Int. Cl.⁴ ................................................ B05D 3/06

[52] U.S. Cl. ........................................ 427/39; 427/40; 427/282; 427/287; 427/304; 427/305; 427/306; 427/437; 427/438

[58] Field of Search ................... 427/39, 40, 282, 287, 427/304, 305, 306, 437, 438

[56] References Cited

U.S. PATENT DOCUMENTS 2,919,207 12/1959 Scholzel .............................. 117/106
3,243,363 3/1966 Helwig .............................. 204/164

Primary Examiner—Bernard D. Pianalto
Attorney, Agent, or Firm—Michael J. Striker

[57] ABSTRACT

A method of producing electrically conductive structures on non-conductors, in which the deposition of metallic films on non-conductive substrates is carried out by disintegration of metallo-organic compositions in a glow discharge zone of a plasma reactor.

13 Claims, No Drawings

METHOD OF PRODUCING METALLIC STRUCTURES ON NON-CONDUCTORS

BACKGROUND OF THE INVENTION

The present invention relates to a method of manufacturing metallic or electrically-conductive structures on non-conductors or non-conductive surfaces.

Electrically conductive structures or conductive paths are normally produced on substrates made of ceramics, plastics, glass and various non-conductive compounds. Conductive paths should be manufactured with high precision to meet requirements of numerous applications of such structures in contemporary electronics.

The production of such conductive paths is usually obtained by a wet chemical process which means that a non-conductive outer surface which is provided with a conductor-building mask is immersed into wetty solutions of washing and conditioning agents and then is placed into noble metal-containing solutions, mostly palladium-containing solutions, and is there "contaminated" with noble metal ions. These "contaminated" particles are then reduced in solutions containing a reduction agent to metallic atoms. Finally a suitable metallizing takes place in a chemically-reductive copper or nickel bath operating without external current. The object being treated is thoroughly rinsed in clean water between the operations.

The above described method has, however some disadvantages which reside in that many working and rinsing steps are required. Also, there is the danger that the treatment solutions would be contaminated by residuals adherent to the substrate treated by previous solutions, this would result in a non-satisfactory metallizing. Treatment solutions are partially agressive and can cause damage or distortion of a covering lacquer or foil; therefore unclean metallic structures result, particularly in case of fine conductive paths which can lead to a partial or complete failure of produced printed circuit boards during further application.

Plasma (glow discharge) has been utilized before for various purposes. For example, hydroxides of aluminum oxide ceramics have been produced in plasma as well as hydroxides of silicon, siliconoxides and silicon-nitrides.

Another field in which glow discharge or plasma arc has been utilized is the method of manufacturing thin polymer layers or coatings on solid-state bodies made of inorganic monomers. In the same manner are produced hard resistant polymer films with high isolating properties, for example of acetylene, styrol, benzene, metane, etc. in the presence of carrier gases such as helium and argon. If additional metallo-organic compounds, for example tetramethyl tin, are found in the gas mixture polymeric organometallic films are obtained. Pure metal-oxides which are very important in the field of sensor and semiconductor electronics can be made in the same manner of metalloorganic compositions with the carrier gas or without the latter under the effect of glow discharge.

Also, the decomposition of the nickeltetracarbonate to metallic nickel and the decomposition of the molybdenum hexacarbonyl to molybdcnum-carbon films have been disclosed; the disclosures, however, give no hint that certain metallic structures can be produced on non-conductive surfaces. It should be also considered that metalcarbonyls are highly poisonous cancer-causing substances which have found no technical applications.

Also known is the thermal decomposition of metalloorganic compounds in vacuum whereby metallic coatings can be deposited on a substrate. However, in this known method, the substrate must be heated up to at least 200° C., in practice to 300°–400° C.

SUMMARY OF THE INVENTION

It is an object of the present invention to provide an improved method of producing metallic structures on non-conductive substrates.

It is another object of this invention to avoid the whole wet chemical process up to a chemical copper-plating.

These and other objects of the invention are attained by a method of producing electrically-conductive structures on non-conductors, comprising the step of depositing a metallic film by disintegration of metallo-organic compositions in a glow discharge zone.

The metallic film, obtained in the glow discharge zone, may be reinforced in a bath for a chemically-reductive metal deposition.

The glow discharge zone is part of the plasma reactor.

The structures may be pre-shaped before treatment in the plasma reactor by application to the non-conductors of masks or by covering the non-conductors with screen-printing lacquers or photo-sensitive lacquers.

The conductive structures can be shaped after treatment in the plasma reactor by means of photoresistors, photo-sensitive lacquers or screen-printing lacquers.

Organic copper tin or palladium compositions may be used in said depositing step for depositing a metallic film.

The reinforcing step may be carried out either in the copper bath or nickel bath.

Due to the method of this invention the whole wet chemical process for electroplating can be omitted.

DETAILED DESCRIPTION OF THE PREFERRED EMBODIMENTS

According to the present invention the depositing of metallic films on substrates is performed by disintegration of metallo-organic compounds in a glow discharge zone. Thereby the entire wet chemical process up to the chemical electroplating are avoided.

Due to the invention it is attained that the metallizing of the non-conductive surface by the disintegration of metallo-organic compositions is conducted in plasma. This can be obtained by the current of intensity up to about 2000 Å which can be amplified to obtain a desired thickness of the metal layer directly, e.g. without a preliminary treatment, in a chemical copper or nickel bath.

In the method according to the present invention metallic structures are produced in plasma. The basic advantage of this method resides in that the temperature of the substrate is below 100° C., and often it is only between the room temperature and 80° C. Thereby an extremely fine treatment of the material is obtained, which is specifically important in case of plastics.

In the method of this invention normal plasma reactors are utilized, which are mainly known as tubular or tunnel reactors or parallel-plate reactors. Plasma for manufacturing metallic structures can be produced with direct current or alternating current or with high frequency in the range between 2 MHz and 50 MHz. Pressure in the plasma chamber is 0.1–2.0 hPa; this is also advantageous as compared, for example with the cathode vaporization (sputtering) or vapor-deposition; no high vacuum with pressures less than 3 Pa is required, which pressures should meet the high requirements of vacuum applications.

All customary inorganic or organic non-conductors can be used as substrates on which metallic structures are to be deposited. Such non-conductive materials are, for example aluminum oxide ceramics, silicon-oxide ceramics, glass, metals with oxide and nitride coatings or plastics. These materials can be made as solid-state materials or foils and can be one layer or multi-layer materials.

The transmission of a conductive image to the substrate is carried out with the aid of screen-printing lacquers, light-sensitive lacquers or photoresistor films in accordance with the conventional methods of additive, semi-additive or substractive techniques or with the aid of simple masks.

To make available metallic atoms in the glow discharge zone for building up metallic layers on the substrates, such organic metallic compositions are utilized, which are sublimable. These compositions are thinned with carrier gases to produce uniform, cohesive and porous-free layers. Inert gases, such as argon or helium, or reducing gases such as hydrogen are suitable as carrier gases; the mixtures of such gases can be also utilized. The feeding of organo-metallic compositions is carried out after producing a vacuum outside the glow discharge zone in the flow of the carrier gas so that a uniform gas mixture is produced in a primary reaction region. The supply container for the metallic composition is provided with a device for heating in order to guide hardly sublimable metallic compositions in sufficient amounts in the gas stream.

The invention can be clarified with the following examples:

EXAMPLE 1

Deposition of Copper onto Ceramics

| Substrate | Aluminmoxide ceramics |
| --- | --- |
| Metallo-organic composition | Copperhexafluoracetonylacetate |
| Heating of the supply container | 60° C. |
| Carrier gas | Argon |
| Reactor | Parallel-plate |
| Elektrode temperature | 40° C. |
| Frequency | 13.56 MHz |
| Power intensity | 0.3 Watt/cm$^2$ |
| Pressure in the reactor | 0.5 hPa |
| Reaction time in the plasma chamber | 90 Minutes |

Ceramic plates of the size 50×50×1.5 mm are laid on the lower electrode of the reactor. The reactor is evacuated to a given pressure and a plasma arc is generated in the reactor. The copper composition is sublimited by heating up and is brought with the carrier gas into the glow discharge zone of the reactor. A uniform porous-free copper film of 600–800 Å thickness is deposited on the face of ceramics.

Then the ceramic plates are removed from the reactor and are coated directly, without further treatment with photoresistors. Thus printed circuit boards are manufactured by the known methods, by making conductive paths, exposure and development.

After the development the conductive paths are strengthened in a chemically-reductive copper bath to a desired thickness. Finally a hardened resistor film is removed and the copper film of 600–800 Å positioned below the same is removed from the plasma coating. The conductor image with fine structures and conductor path flanks normal thereto result.

EXAMPLE II

The Deposition of Tin on the Glass

| Substrate | Silicate glass covered with a negative mask of desired structure |
| --- | --- |
| Metallo-organic composition | Tetramethyl tin |
| Carrier gas | Helium |
| Reactor | Parallel-plate |
| Elektrode temperature | 100° C. |
| Frequency | 27.12 MHz |
| Power intensity | 0.6 Watt/cm$^2$ |
| Pressure in the reactor | 0.4 hPa |
| Reaction time in plasma | 60 Minutes |

Glass plates of the size 30×40×2 mm are mechanically covered with a mask of stainless steel or plastic foil in such a fashion that the regions of the surface of the glass plate which must contain metallic structures remain free.

The plates are laid on the lower electrode of the reactor, the reactor is evacuated and plasma is ignited therein. The tetramethyl tin with the carrier gas are fed into the glow discharge zone of the reactor. Within about 60 min, a uniform glossy tin film of the thickness of 700–1000 Å is deposited on the outer surface of the substrate. A portion of the tin film can contain a carbon. The plates are eventually removed from the reactor and the mask is removed from the outer surface of the substrate. An exact reproduction of the structures provided due to the mask is therefore obtained. The metallic layer can be reinforced or thickened in the chemically-reductive bath. In order to have similar results when no mechanically-applied masks are utilized the structures can be made with the aid of screen printing or photo-sensitive lacquers before the treatment in plasma has taken place.

EXAMPLE III

The Deposition of Palladium on Polyimid Foils

| Substrate | Polyimide foil 40 × 65 × 0.1 mm |
| --- | --- |
| Metallo-organic composition | π-Allyl-π-Cyclopentadienyl-Palladium (II) |
| Heating of the supply container | not required |
| Carrier gas | Argon |
| Reactor | Parallel-plate |
| Elektrode temperature | 30° C. |
| Voltage | Direct voltage 300 V |
| Power | 30 Watt |
| Power intensity | 0.1 Watt/cm$^2$ |
| Pressure in the reactor | 0.15 hPa |
| Reaction time in plasma | 10 Minutes |

The manufacture of structures of palladium can be carried out either according to Example I with the aid of photoresistors or according to Example II by applying masks. A glossy palladium film of about 1000 Å thick results within a given time.

It will be understood that each of the elements described above, or two or more together, may also find a useful application in other types of methods of manufacturing electrically conductive structures on non-conductors differing from the types described above.

While the invention has been illustrated and described as embodied in a method of manufacturing electrically conductive structures on non-conductive surfaces, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of producing electrically-conductive structures on non-conductors, comprising the steps of providing a plasma reactor having a glow discharge zone; placing said non-conductors on an electrode of said plasma reactor; evacuating said plasma reactor to a given pressure; and then feeding into said glow discharge zone metallo-organic compositions together with a carrier inert gas so that a metallic film is deposited on said non-conductors by disintegration of metallo-organic compositions in said glow discharge zone, said carrier inert gas being argon or helium.

2. The method as defined in claim 1, wherein the metallic film, obtained in the glow discharge zone, is reinforced in a bath for a chemically-reductive metal deposition.

3. The method as defined in claim 2, wherein the reinforcing of the metallic film is carried out in a chemically-reductive copper bath.

4. The method as defined in claim 2, wherein the reinforcing of said metallic film is carried out in a chemically-reductive nickel bath.

5. The method as defined in claim 1, wherein said structures are pre-shaped before a treatment in said plasma reactor by application to said non-conductors of masks.

6. The method as defined in claim 1, wherein said structures are pre-shaped before a treatment in said plasma reactor by covering said non-conductors with screen printing lacquers.

7. The method as defined in claim 1, wherein said structures are pre-shaped before a treatment in said plasma reactor by covering said non-conductors with photo-sensitive lacquers.

8. The method as defined in claim 1, wherein said structures are made after a treatment in said plasma reactor by means of photoresistors.

9. The method as defined in claim 1, wherein said structures are made after a treatment in said plasma reactor by means of photo-sensitive lacquers.

10. The method as defined in claim 1, wherein said structures are made after a treatment in said plasma reactor by means of screen printing lacquers.

11. The method as defined in claim 1, wherein organic copper compositions are used for depositing a metallic film.

12. The method as defined in claim 1, wherein organic tin compositions are used for depositing a metallic film.

13. The method as defined in claim 1, wherein organic palladium compositions are used for depositing a metallic film.

* * * * *